(12) United States Patent
Moessner et al.

(10) Patent No.: US 8,908,385 B2
(45) Date of Patent: Dec. 9, 2014

(54) INTERFACE MODULE

(75) Inventors: Claus Moessner, Ispringen (DE);
Burkhard Triess, Ludwigsburg (DE);
Gert Maier, Reutlingen (DE); Peter Bach, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 2437 days.

(21) Appl. No.: 11/659,124

(22) PCT Filed: Jun. 29, 2005

(86) PCT No.: PCT/EP2005/053053
§ 371 (c)(1),
(2), (4) Date: Dec. 16, 2008

(87) PCT Pub. No.: WO2006/015907
PCT Pub. Date: Feb. 16, 2006

(65) Prior Publication Data
US 2009/0086443 A1    Apr. 2, 2009

(30) Foreign Application Priority Data
Aug. 6, 2004    (DE) .......... 10 2004 038 591

(51) Int. Cl.
*H05K 1/18* (2006.01)
*H01L 23/498* (2006.01)
*H05K 3/34* (2006.01)
*H05K 3/22* (2006.01)
*H05K 1/14* (2006.01)

(52) U.S. Cl.
CPC ..... *H01L 23/49827* (2013.01); *H01L 23/49838* (2013.01); *H05K 2203/176* (2013.01); *H05K 2201/10325* (2013.01); *H01L 2924/01078* (2013.01); *H01L 2924/15312* (2013.01); *H05K 3/3436* (2013.01); *H05K 3/225* (2013.01); *H01L 2924/01079* (2013.01); *H05K 2201/049* (2013.01); *H05K 1/141* (2013.01); *H05K 1/144* (2013.01); *H01L 2924/15311* (2013.01); *H05K 2201/10734* (2013.01); *H01L 2224/16* (2013.01)
USPC ........... 361/761; 361/784; 361/785; 361/795; 361/803

(58) Field of Classification Search
USPC .......... 361/782–785, 803, 761–764, 792–795
See application file for complete search history.

(56) References Cited

U.S. PATENT DOCUMENTS

| | | | | |
|---|---|---|---|---|
| 5,462,442 A * | 10/1995 | Umemura et al. | ............... | 439/69 |
| 5,982,635 A * | 11/1999 | Menzies et al. | ............... | 361/790 |
| 6,903,941 B2 * | 6/2005 | Paola | ............... | 361/803 |
| 7,095,619 B2 * | 8/2006 | Panella et al. | ............... | 361/760 |
| 2004/0075164 A1 | 4/2004 | Pu et al. | | |
| 2005/0207131 A1 * | 9/2005 | Prokofiev et al. | ............... | 361/760 |

FOREIGN PATENT DOCUMENTS

| | | |
|---|---|---|
| JP | 2002 141462 | 9/2002 |
| JP | 2002 324878 | 11/2002 |

\* cited by examiner

*Primary Examiner* — Tuan T Dinh
(74) *Attorney, Agent, or Firm* — Kenyon & Kenyon LLP

(57) ABSTRACT

An interface module has an integrated component for replacing a component on a circuit board, the terminal contacts on the bottom side of the interface module being designed as provided for the contacts of the component on the circuit board, the interface module being divided into an adaptor part as a base module and a protocol converter part as a tool access module.

19 Claims, 3 Drawing Sheets

INTERFACE MODULE

FIELD OF THE INVENTION

The present invention is directed to an interface module having an integrated component.

BACKGROUND INFORMATION

Such interface modules are used in different applications. One possibility is, for example, to replace a memory module of a control unit with such an interface module having an integrated component. The actual memory module, for example, an EPROM, EEPROM, flash memory, RAM, etc., is replaced by an interface module having an emulator memory, e.g., via an emulator probe. Such an interface module may also be referred to as a memory interface. This memory interface makes it possible to access memory data of a control unit using a software tool via an external device known as a tool computer (e.g., a PC) and execute measuring and calibration applications on the control unit.

However, microcontrollers of a control unit itself may also be replaced by this interface module having an integrated component, in which case the component is a microcontroller. For this reason, the interface module having an integrated component is referred to hereinafter as a microcontroller interface. This designation, however, should not be regarded as a limitation with respect to the application, as evidenced by the above discussion.

Microcontroller interfaces are in particular devices enabling a software tool to access signals of microcontroller units (MCU). The microcontroller is installed at the site of use (e.g., in a control unit in the engine compartment of a motor vehicle) and is situated on a control unit board or circuit board. The software tool is executed on an external computer, known as a tool computer (for example, a PC). Using this design, different activities may be performed.

Measurement & Calibration

Rapid-Prototyping

Debugging and/or Error Tracing

The related art is the use of a printed circuit which is installed between the control unit board and the microcontroller. For this purpose, the microcontroller is removed from the standard control unit and replaced by an intermediate base. The microcontroller interface, which contains the electronic components needed for protocol conversion, access for the software tool, i.e., the tool computer (plug or cable), and a microcontroller in a standard housing, is plugged onto this intermediate base. This design and the additional electronic components make the surface area of the microcontroller interface, i.e., the interface module, considerably larger than the surface area of the microcontroller itself.

This represents a disadvantage, since no high components should be situated on the control unit board under the interface module, i.e., the microcontroller interface. Furthermore, it must be made sure that the interface module does not protrude over one or more sides beyond the circuit board surface of the control unit. Tool manufacturers and control unit manufacturers must precisely coordinate the mechanical dimensions of their particular products. This is difficult, since in particular in the starting phase of control unit development, the arrangement of the components may change considerably. Nevertheless, the interface module or interface development must be started as early as possible, since the microcontroller interface must be available at the same time as the control unit.

The monolithic design represents another disadvantage. The entire interface module having the integrated component, adapted to the installation site and having the signals adapted for transmission onto the tool computer, is implemented inseparably in a printed circuit. The adaptation to the installation site is, however, dependent on the mechanical shape (e.g., housing) and on the type of the microcontroller, while adaptation of the signals depends on the activity performed. For example, when measuring and adjusting, microcontroller functions and interfaces other than in debugging must be accessed. Therefore, a large number of interface module or interface variants results, which are complicated to manufacture and to manage.

It is apparent that the related art has not succeeded in delivering optimum results in all respects. Therefore, an object of the present invention is to provide an interface module which has a high degree of flexibility regarding the installation site, while the number of variants may be limited.

SUMMARY OF THE INVENTION

The present invention is directed to an interface module having an integrated component for replacing a component on a circuit board, the terminal contacts on the bottom of the interface module being designed as provided for the contacts of the component on the circuit board, the interface module being advantageously divided into an adaptor part as a base module and a protocol converter part as a tool access module.

The integrated module is advantageously integrated into the base module using chip scale package technology, which makes a smaller package possible.

It is furthermore advantageous that the integrated component is contained in the base module, and the base module contains an adaptor base, the integrated module and the adaptor base being designed as a ball grid array (BGA).

The base module is advantageously formed from an adaptor base and a carrier substrate, the adaptor base containing adaptor contacts and the carrier substrate having terminal contacts, the adaptor contacts being connected to terminal contacts via connections in the carrier substrate, in particular conductors, making a highly flexible adaptation to different terminal variants possible.

The tool access module is advantageously formed from a module substrate and an adaptor, the module substrate and the adaptor being connected via adaptor-substrate contacts.

It is furthermore advantageous that the base module and the tool access module are connected via plug-in contacts and sockets, the adaptor base having the sockets and the adaptor having the plug-in contacts.

In a first embodiment, the integrated component is a microcontroller, which also includes processors, in particular also special processors such as signal processors (DSP), etc., or other intelligent components.

In a second exemplary embodiment, the integrated component is a memory module, which includes in particular any programmable memory such as EPROM, PROM, RAM, EEPROM, flash memory, etc.

The interface module, i.e., the microcontroller interface according to the present invention, therefore has the advantage that the interface has almost exactly the same surface area as the component, e.g., the microcontroller which it replaces. This significantly simplifies the coordination between the tool manufacturer and the control unit manufacturer. The control unit manufacturer is not subject to any limitation regarding the circuit board layout. Components of any height may be placed directly next to the microcontroller.

In addition, due to the physical separation between the adaptor part and the protocol converter part, the number of variants, in particular of the microcontrollers needed, is considerably reduced. The number of products to be manufactured may be reduced and the management and servicing may be simplified due to the interface modules having standardized adaptor parts or interfaces. An ideal combination of adaptor part and protocol converter may thus be provided for each combination of microcontroller and performed activity. The modules may be delivered by different suppliers. The modules are connected via contacts that are mechanically reliable and suitable for automobiles.

BRIEF DESCRIPTION OF THE DRAWINGS

The Figures show different views of a highly simplified, not-to-scale exemplary embodiment of the interface module according to the present invention, in particular the microcontroller interface or memory interface. The interface has two physically separated modules, which may be plugged in together via contacts. The base module (labeled using numerals 1 through 8) implements the adaptor part, while the tool access module (labeled using the letters A through E) implements the protocol part.

DETAILED DESCRIPTION

According to the present invention, the microcontroller interface is considered as two logical parts:
1) An adaptor part, which contacts the required input/output pins (I/O pins) of the microcontroller.
2) A protocol converter, which converts MCU signals in such a way that they are reliably transmissible over longer distances.

In the related art, this is implemented in a monolithic design. The adaptor part and the protocol converter are inseparably implemented in a printed circuit. However, the adaptor part is dependent on the mechanical design (e.g., housing) and on the type of the microcontroller, while the protocol converter depends on the activity performed. A high number of interface variants result in this way in the related art, which are costly to manufacture and manage. This disadvantage is eliminated and the system is improved by the physical separation according to the present invention into an adaptor part as a base module (100) and a protocol converter part as a tool access module (200).

Figure 1:
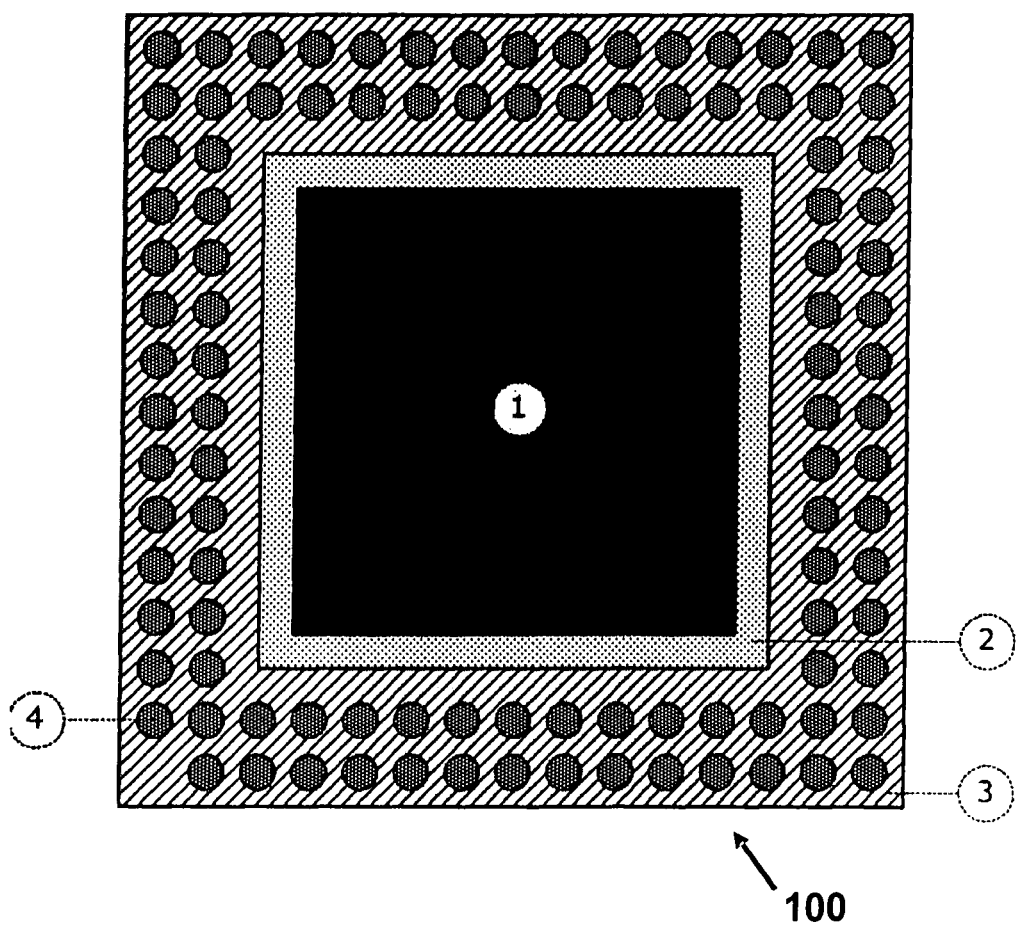
FIG. 1 shows a top view of the base module.

FIG. 1 shows a top view of the exemplary embodiment of base module 100 of the interface module according to the present invention as a microcontroller interface or memory interface. In the exemplary embodiment shown here, adaptor base 3 forms the frame of base module 100. This is a BGA (ball grid array) base having two rows of contacts on all four sides. A corner pin of adaptor base 3 is missing for coding against misinstallation.

Integrated component 1, in particular the microcontroller or memory module, is located in the free space of the adaptor base. The component, in particular the microcontroller, is implemented as a chip scale package (CSP). This is a housing of highly reduced dimensions, which contains the same chip die (internal chip substrate, microboard) as the standard housing, but has a denser contact layout, i.e., a smaller pitch. This makes it possible to achieve the same microcontroller functionality in a smaller package.

Adaptor base 3 and the microcontroller as integrated component 1 are designed as a ball grid array (BGA) and soldered onto a carrier substrate 2. Alternatively, a gluing method may also be used.

All microcontroller signals required for adaptation are accessible via sockets 4 of adaptor base 3 from above.

The above-described design provides a base module 100 having the same surface area and the same pinout, i.e., the same terminal contact system, as the standard component, i.e., the standard microcontroller or standard memory, which is normally used, in mass manufacture in particular, and is to be replaced according to the present invention.

Figure 2:
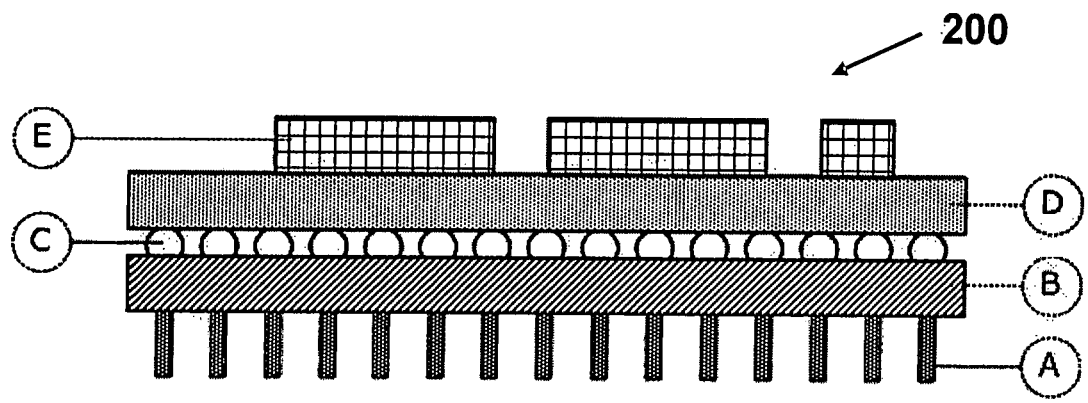
FIG. 2 shows a side view of the tool access module.
Figure 3:
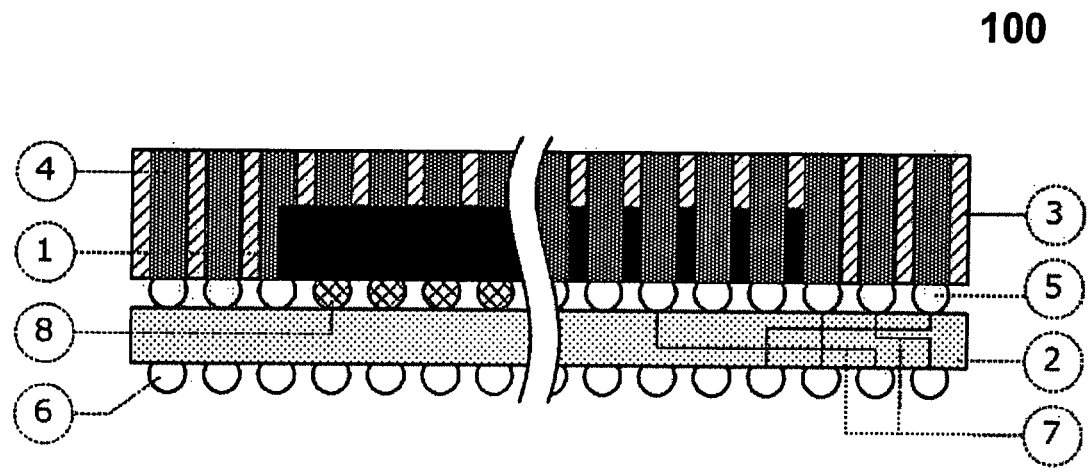
FIG. 3 shows side views of different depths regarding the base module.

FIGS. 2 and 3 show the exemplary embodiment of the interface module, i.e., microcontroller interface according to the present invention, in side view. FIG. 3 shows the base module, and FIG. 2 shows the tool access module.

In FIG. 3, the left-hand half from the wavy line shows a section through the component, the microcontroller itself, i.e., the inside of the base module, and the right-hand half from the wavy line shows the side view as a top view from the outside onto base module 100.

In FIG. 3, the component, i.e., microcontroller 1 with its adaptor contacts 8 designed as BGA contacts in particular, is soldered onto carrier substrate 2 (or otherwise bonded) and is covered by the front of adaptor base 3. Adaptor base 3 is also soldered (or otherwise bonded) onto carrier substrate 2 via socket contacts 5. The contacts of base module 100 which correspond to the pinout of the microcontroller in the standard housing are applied to the bottom side of carrier substrate 2. A contact between these contacts 6 and the contacts on the top side for the microcontroller, adaptor contacts 8, and socket contacts 5 is established via connections, in particular conductors 7 in the carrier substrate. This makes it possible to adapt the most diverse components to the most diverse contact points without problems.

An interface module, in particular in circuit board technology, is shown; it has an IC component 1 in a chip scale package and a surrounding adaptor base 3, the interface module having pinout 6 of the IC component from below in the standard housing and all IC signals between chip scale package contacts or adaptor contacts 8 and module terminal contacts 6 being correctly and fully wired in carrier substrate 2, and all signals required for adaptation being supplied to the uppermost layer of carrier substrate 2 and connected to contacts 5 of adaptor base 3 and being available at contact sockets or receptacles 4 on the top side of base module 100.

FIG. 2 shows tool access module 200, which may be plugged onto base module 100. This tool access module 200 has a module substrate D having electronic components E, which are connected below to an adaptor B via adaptor-substrate contacts C.

Plug-in contacts A of tool access module 200 establish the connection to contact sockets 4 of the base module. A module substrate D, in circuit board technology in particular, is shown as an example; it has one or more electronic components E soldered or glued onto it, which are soldered or glued to a (BGA) adaptor B, which may be connected to the contact sockets or plug-in sockets 4 of base module 100 via plug-in contacts A. Electronic components E are used, in particular for protocol conversion from the local microcontroller buses into transmissible protocols. JTAG, Nexus, or AUD may be used, for example, as a microcontroller bus, or also the local address bus, data bus, and control bus. The above-named buses are used for connecting a calibration RAM, which is designed in particular as a dual-ported RAM. The transmissible protocol is designed in particular as a 100 Mbit/s Ethernet according to IEEE 802.3. A protocol according to IEEE 802.3u (100 Mbit/s) or IEEE 802.ab (1 Gbit/s) is also advantageously used.

Figure 4:
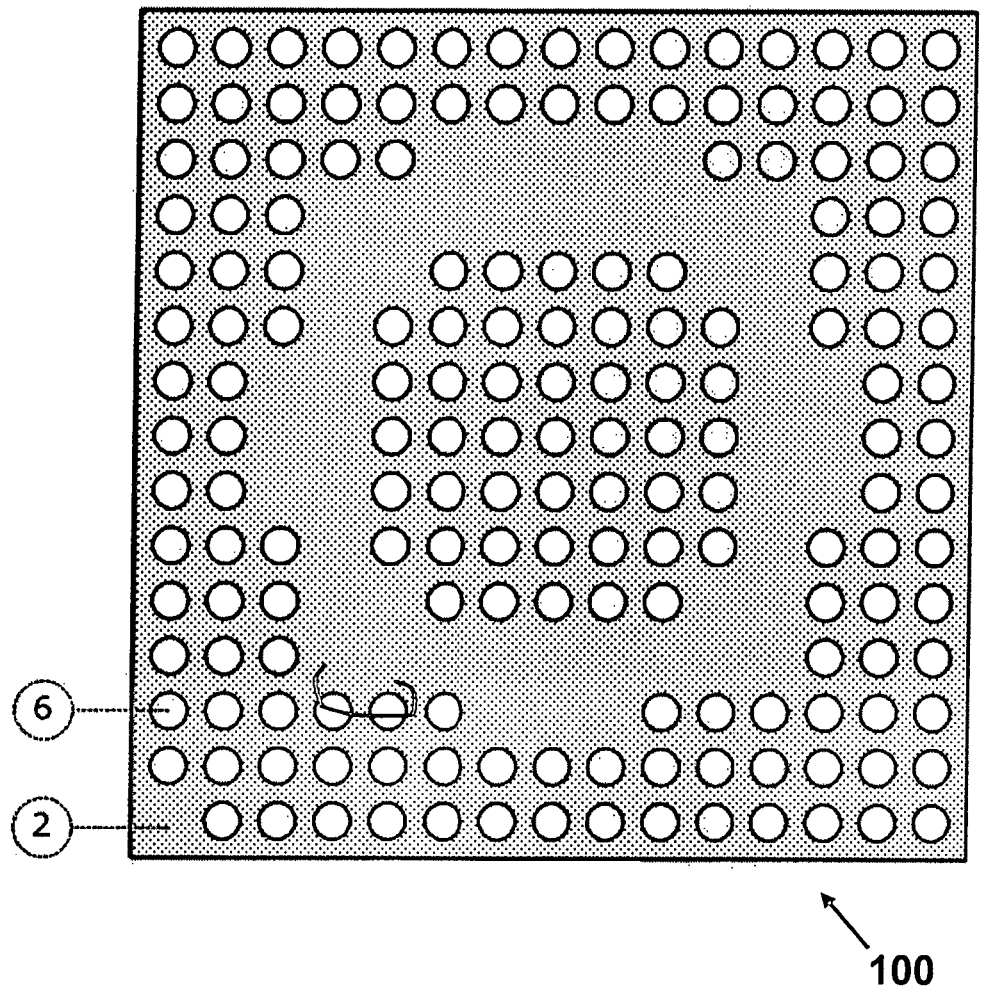
FIG. 4 finally shows the interface module, i.e., the base module from below.

Finally, FIG. 4 shows the same exemplary embodiment of the interface module according to the present invention, i.e., microcontroller interface or memory interface from below.

Carrier substrate 2 of base module 100 has, as mentioned previously, the same pinout, i.e., the same contacts 6 and almost the same or exactly the same surface area as the standard housing of the component, in particular of the microcontroller. The base module is connected to the circuit board, in particular of the control unit, via terminal contacts 6.

What is claimed is:

1. An interface module having an integrated component for replacing a component on a circuit board, comprising:
    an adaptor part as a base module, wherein the integrated component is contained in the base module, and wherein terminal contacts are provided on a bottom side of the base module; and
    a protocol converter part as a tool access module, wherein the tool access module is provided above and coupled to the base module containing the integrated component;
    wherein the base module is formed by an adaptor base and a carrier substrate;
    wherein the adaptor base has adaptor contacts and the carrier substrate has the terminal contacts, the adaptor contacts being connected to the terminal contacts via connections in the carrier substrate.

2. The interface module according to claim 1, wherein the integrated component is integrated into the base module using chip scale package technology.

3. The interface module according to claim 1, wherein the base module contains the adaptor base, the integrated component and the adaptor base being designed as a ball grid array.

4. The interface module according to claim 1, wherein the tool access module is formed by a module substrate and an adaptor.

5. The interface module according to claim 1, wherein the base module and the tool access module are connected via plug-in contacts and contact sockets.

6. The interface module according to claim 1, wherein the integrated component is a microcontroller.

7. The interface module according to claim 1, wherein the integrated component is a memory module.

8. The interface module according to claim 4, wherein the module substrate and the adaptor are connected via adaptor-substrate contacts.

9. The interface module according to claim 5, wherein the base module has the adaptor base, which in turn has contact sockets, and the tool access module has an adaptor, which in turn has plug-in contacts.

10. The interface module according to claim 7, wherein the memory module is programmable.

11. An interface module having an integrated component for adapting a component on a circuit board, comprising:
    an adaptor part as a base module, wherein the base module is formed by an adaptor base and a carrier substrate, and wherein the bottom side of the carrier substrate has terminal contacts, and wherein the integrated component is disposed on the carrier substrate, and wherein adaptor contacts of the integrated component disposed on the carrier substrate are connected to the terminal contacts via connections in the carrier substrate, and wherein all signals of the component on the circuit board required for the adaptation are routed to the top side of the base module through the adaptor base; and
    a protocol converter part as a tool access module, wherein the tool access module has electronic components for a protocol conversion of local microcontroller buses into transmittable protocols, and wherein the base module and the tool access module are connected via plug-in contacts of the tool access module and contact sockets of the base module.

12. The interface module as recited in claim 11, wherein the integrated component is integrated into the base module using chip scale package technology.

13. The interface module as recited in claim 11, wherein the integrated component and the adaptor base are designed as ball grid array.

14. The interface module as recited in claim 11, wherein the tool access module is formed by a module substrate and an adaptor.

15. The interface module as recited in claim 11, wherein the tool access module includes an adaptor, and wherein the plug-in contacts of the tool access module are provided as part of the adaptor.

16. The interface module as recited in claim 11, wherein the integrated component is a microcontroller.

17. The interface module as recited in claim 11, wherein the integrated component is a memory module.

18. The interface module as recited in claim 17, wherein the memory module is programmable.

19. The interface module as recited in claim 14, wherein the module substrate and the adaptor are connected via adaptor-substrate contacts.

* * * * *